United States Patent [19]

Suzuki et al.

[11] 4,430,138
[45] Feb. 7, 1984

[54] MICROWAVE PLASMA ETCHING APPARATUS HAVING FAN-SHAPED DISCHARGE

[75] Inventors: Keizo Suzuki; Sadayuki Okudaira; Shigeru Nishimatsu, all of Kokubunji; Ichiro Kanomata, Fuchu, all of Japan

[73] Assignee: Hitachi, Ltd., Tokyo, Japan

[21] Appl. No.: 138,082

[22] Filed: Apr. 7, 1980

[30] Foreign Application Priority Data

Apr. 6, 1979 [JP]  Japan ............................. 54-41109

[51] Int. Cl.$^3$ ............................................. C23F 1/02
[52] U.S. Cl. .................................... 156/345; 118/720; 118/730; 156/643; 204/192 E; 204/298
[58] Field of Search .......... 204/192 R, 192 E, 298; 156/345, 643; 118/720, 50.1, 721, 730

[56] References Cited

U.S. PATENT DOCUMENTS

| | | | |
|---|---|---|---|
| 2,160,981 | 6/1939 | O'Brien | 118/720 |
| 2,432,950 | 12/1947 | Turner et al. | 118/720 |
| 2,997,979 | 8/1961 | Tassara | 118/720 |
| 3,442,572 | 5/1969 | Illsley et al. | 118/720 |
| 3,502,051 | 3/1970 | Adams | 118/730 |
| 3,561,993 | 2/1971 | Geffcken | 118/730 |
| 3,636,916 | 1/1972 | Thelen et al. | 118/730 |
| 3,664,948 | 5/1972 | Graffeo et al. | 204/298 |
| 3,677,924 | 7/1972 | Cash et al. | 204/192 R |
| 3,827,966 | 8/1974 | Needham | 204/192 R |
| 4,094,722 | 6/1978 | Yamamoto et al. | 156/345 |

FOREIGN PATENT DOCUMENTS 318638  12/1971  U.S.S.R. ............................. 118/720

OTHER PUBLICATIONS

Horike et al., "A Dry Etching ... Microwave", Electrochemical Society-Semiconductor Silicon, p. 1071ff (5/77).
Suzuki et al., "Microwave ... Etching", Japanese J. of Applied Physics, vol. 16, No. 11 (11/77) pp. 1979-1984.

*Primary Examiner*—Jerome W. Massie
*Attorney, Agent, or Firm*—Antonelli, Terry & Wands

[57] ABSTRACT

In a microwave plasma etching apparatus wherein the surface of a sample is exposed to a plasma generated by microwave discharge, thereby to subject the sample surface to an etching processing; the sample is transported while revolving along a circular orbit in a plasma exposure region, and the section of the plasma exposure region is put into the shape of a fan whose pivot coincides with the central point of the circuit orbit, whereby the enhancement of the etching processing capability and the uniformity of the etching speed are achieved.

1 Claim, 4 Drawing Figures

MICROWAVE PLASMA ETCHING APPARATUS HAVING FAN-SHAPED DISCHARGE

BACKGROUND OF THE INVENTION

1. Field of the Invention

This invention relates to improvements in an etching apparatus utilizing a microwave discharge plasma, and more particularly, to an enhancement in the etching performance as well as an improvement in the processing capability of the etching apparatus.

2. Description of the Prior Art

In recent years, in the field of surface processing of semiconductors and metals, the conventional wet processing method has been extensively replaced by a dry processing method. As one type of apparatus suitable for the dry etching of a semiconductor surface, the inventors have previously developed an etching apparatus which uses a microwave discharge plasma for the etching operation, as disclosed in Japanese Patent Application Publication No. 44795/1978.

This microwave plasma etching apparatus is constructed such that the surface of a sample is exposed to the plasma produced by a microwave discharge, so as to etch and process the sample surface. This technique has the advantage that a fine etching is possible with the chance of damage to the sample lessened. On the other hand, however, if the etching of the sample surface is performed under conditions in which a single sample, or a small number of samples, is inserted and fixed in a plasma exposure region in the conventional manner, a problem will occur with respect to the processing capability. Moreover, it is feared that the continuous exposure of the sample to the plasma for too long a time will raise the temperature of the sample excessively, resulting in various drawbacks, such as the changing of the quality of the photoresist mask overlying the sample surface.

As an expedient for solving these problems, there has been proposed an apparatus wherein a plurality of samples are placed on a turntable and wherein, as the turntable rotates, the plurality of samples pass through a plasma exposure region in succession, as disclosed in Japanese Patent Application Publication No. 34463/1978. According to this method, it becomes possible to etch and process the plurality of samples simultaneously, so that the processing capability of the apparatus is markedly enhanced. In addition, since the individual samples are alternately subjected to heating and cooling periodically, an excessive temperature rise in the samples is avoided.

With this method, however, since the samples are transported within the plasma exposure region, which provides a substantially-uniform plasma density, while revolving along a circular path, the etching speed on the surface of each sample differs depending upon the distance of the point on the sample from the center of revolution thereof, resulting in the difficulty that a uniform etching of the sample cannot be obtained over the whole sample surface. In other words, since the points on the sample will be moving at different speeds depending on their distance from the center of the turntable, each point will be in the plasma exposure region for a different length of time, causing a variation in the degree of etching across the surface of the sample.

SUMMARY OF THE INVENTION

It is accordingly an object of this invention to provide an apparatus which eliminates differences in the degree of etching on the surface of each sample attendant upon the revolving transportation of samples in the microwave plasma etching apparatus as described above and which can carry out a uniform etching over the entire sample surface.

In order to accomplish this object, the present invention provides a microwave plasma etching apparatus including means to expose a surface of a sample to be etched and processed, to a microwave discharge plasma, and means to transport the sample surface within an exposure region of the plasma while revolving along a circular path, characterized in that the plasma exposure region is formed into the shape of a fan whose pivot lies on a center of the circular path. By such a construction, the excessive temperature rise of the sample in the plasma is avoided, and simultaneously, all positions of the sample surface passing through the fan-shaped plasma exposure region are exposed to the plasma for an identical period of time during each revolution, so that etching speeds become equal over the whole sample surface to afford a uniform etching thereof. In addition, the processing capability of the apparatus can be sufficiently raised by introducing a plurality of samples into the plasma exposure region along the circular orbit in succession.

Other objects and features of this invention and the resulting functional effects will become obvious from the following detailed description taken in connection with various exemplary embodiments.

Hereunder, the embodiments of this invention will be described in detail with reference to the accompanying drawings.

DESCRIPTION OF THE PREFERRED EMBODIMENTS

Figure 1:
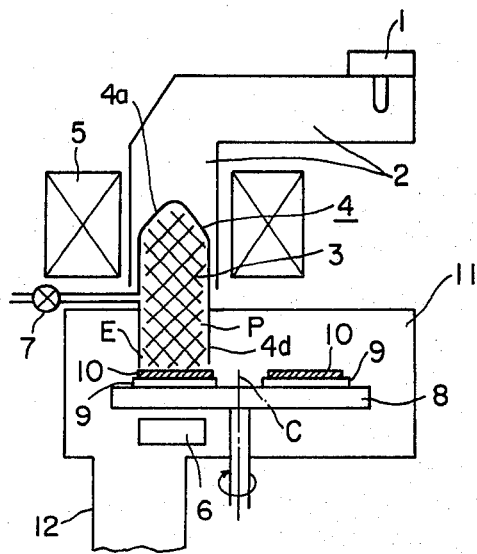
FIG. 1 is a vertical sectional schematic view showing an example of the general construction of a microwave plasma etching apparatus according to an embodiment of this invention.

FIG. 1 shows the general construction of a microwave plasma etching apparatus according to an embodiment of this invention. Referring to the figure, microwaves generated by a microwave oscillator 1 are introduced through a waveguide 2 into a discharge chamber 3 which is formed in a discharge tube 4. The interior of the discharge chamber 3 is hermetically sealed from the side of the waveguide 2 by means of an upper-end sealing portion 4a of the discharge tube 4 which is made of a heat-resisting dielectric substance, for example, quartz, alumina or the like. The lower end of the discharge chamber 3 communicates with a sample chamber 11 through a lower-end opening portion 4d of the discharge tube 4. The internal space of the sample chamber 11 is exhausted to a vacuum through an exhaustpipe 12. In the discharge chamber 3, a magnetic field in the axial direction is generated by a solenoid coil 5 and a permanent magnet 6. A discharge gas, for example, Ar, $O_2$, $N_2$, $CF_4$, etc., suitable for the etching processing of a sample 10 is introduced into the discharge chamber 3 through a leak valve 7. Thus, a plasma P (hatched in the figure) based on the microwave discharge is created in the discharge chamber 3. In accordance with this invention, the plasma P is confined into a sectoral section shape by the sectoral-shaped portion 4d of the discharge tube 4 in the lower-end opening portion (plasma exposure region) E of the discharge chamber 3.

A plurality of sample stands 9 are disposed on an identical circumference on a turntable 8, and the samples 10 are placed on the respective sample stands. Accordingly, the samples 10 are transported on a circular path by the rotation of the turntable 8, whereby they are successively introduced into the plasma exposure region E and subjected to etching therein. Since each sample alternately undergoes heating inside the plasma exposure region E and cooling outside it, any excessive temperature rise of the sample is prevented.

Figure 2:
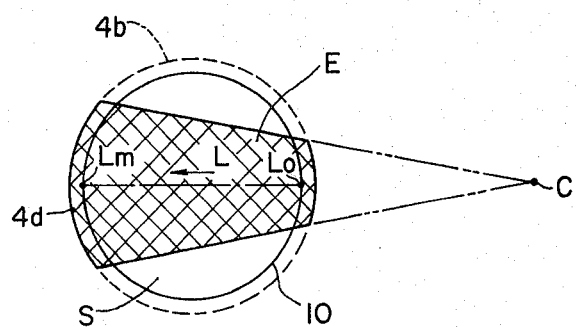
FIG. 2 is a diagrammatic view for explaining the cross-sectional shape of a plasma exposure region in accordance with this invention.

FIG. 2 is an explanatory view of the sectional shape of the plasma exposure region E (region hatched in the figure). As stated above, the plasma exposure region E is sectoral or fan-shaped, that is, it is shaped in such a way that the plasma is confined by the sectoral-shaped portion 4d of the discharge tube 4 so that the exposure time of each point on the sample will be the same for each revolution of the turntable. The center of the sector (a point corresponding to the pivot of the fan) coincides with the center (center of the circular path) C of the revolution of the sample 10 by the turntable 8. Accordingly, when the sample 10 revolves on the circular path about the point C (the sample does not rotate on its own axis), the periods of time for which various points on the surface S of the sample exist within the plasma exposure region E becomes constant irrespective of the distances from the center C of revolution. That is, the various points on the sample surface are exposed to the plasma at an identical density for equal periods of time, so that the uniformity of the degree of etching is maintained for each point on the sample.

In contrast, assuming that in FIG. 2, the plasma exposure region E has a circular sectional shape corresponding to that of a circular sectional portion 4b, the periods of time for which the various points on the sample surface lie within the plasma exposure region will be different depending upon the distances of the various points from the center C of revolution, so that the uniformity of the etching cannot be attained.

Figure 3:
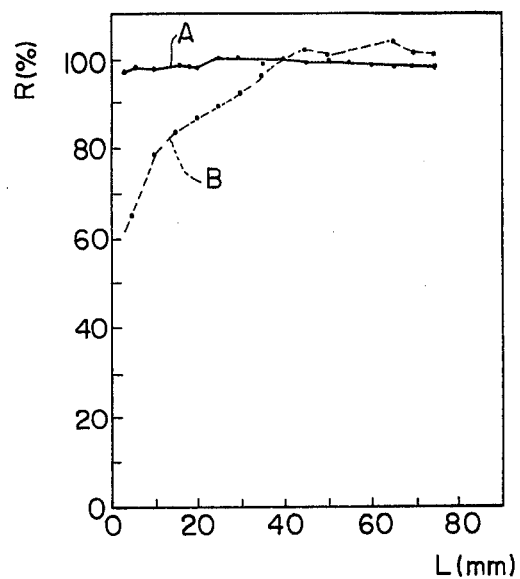
FIG. 3 is a diagram showing the uniformity in the degree of etching in the apparatus of this invention in comparison with the degree of etching in a prior art apparatus.

FIG. 3 shows an example of the comparative measurement of the uniformity of the etching at the time when, while rotating various samples, etching was carried out in cases where the cross sections of the plasma exposure regions were sectoral (curve A) and circular (curve B). In the sample, silicon wafers were used, each having a diameter of 3 inches. The abscissa of the diagram indicates the radial distance L (mm) measured from a sample end $L_o$ which is the nearest to the center of revolution C, as seen in FIG. 2, towards another sample end $L_m$, which is the remotest from the same. The ordinate indicates the etching speed ratio R (%) with 100% being the maximum etching speed in the case of the curve A. The standard deviation value in the curve A was 0.96%, while that in the curve B was 10.9%. It is accordingly understood that the uniformity of the etching speed is enhanced approximately 10 times by making the cross-sectional shape of the plasma exposure region of generally sectoral shape.

Figure 4:
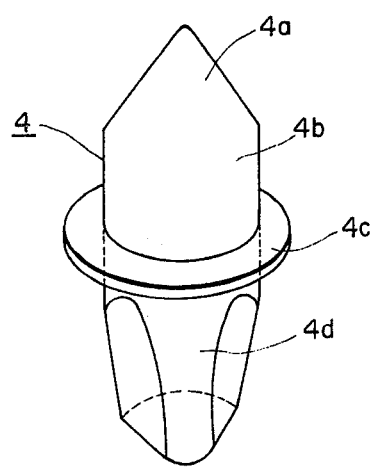
FIG. 4 is a perspective view showing a specific example of the construction of a discharge tube which is used for performing this invention.

FIG. 4 shows a specific example of the structure of the discharge tube 4 for performing this invention. The material of the discharge tube 4 is a heat-resisting dielectric, such as alumina or quartz. In order to execute a hermetic sealing between the discharge tube 4 and the upper wall of the sample chamber 11, a vacuum sealing flange portion 4c is provided. Thus, the position of a vacuum sealing O-ring can be made remote from the inner wall of the discharge tube which comes into contact with the plasma, and the thermal damage of the O-ring is thereby prevented. Microwave power is principally absorbed by a tapered portion 4a and a cylindrical portion 4b. The tapered portion 4a serves to smooth the microwave coupling with the microwave waveguide 2 in FIG. 1, whereby the microwave power is efficiently introduced into the discharge space. The tapered portion 4a and the cylindrical portion 4b form an axially-symmetric structure, whereby a plasma of good uniformity is produced.

In order to form the cross section of the plasma exposure region into a sector, the lower end part of the discharge tube 4 is shaped into a sectoral cross section. To this end, a sectional form-controlling portion 4d is gradually tapered from the cylindrical portion 4b towards the sectoral end part. When the cross-sectional shape of the plasma is confined by the side wall surface of the discharge tube 4, the plasma collides against this side wall surface. However, since the portion 4d is gradually tapered, as described above, the uniformity of the plasma density within the discharge tube is hardly disturbed by the plasma colliding here. In addition, since the heat radiating portion is of a large area, any overheat of the discharge tube is effectively prevented.

When the plasma is not satisfactorily uniform in the plasma exposure region extending along the sample surface, the shape of the plasma exposure region needs to be somewhat changed from the perfect sector in accordance with the extent of such non-uniformity. In this case, the uniformity of the plasma density within the plasma exposure region is experimentally measured, whereupon the sectoral shape may be changed to some extent. It is needless to say that the present invention shall cover all such modifications.

As apparent from the above detailed description, according to this invention, owing to the very simple construction of the apparatus, the temperature rise of the sample in the microwave plasma etching apparatus can be prevented, and the uniformity of the etching speed can be enhanced. This invention is greatly effective when put into practical use.

What is claimed is:

1. A microwave plasma etching apparatus for exposing a sample to a microwave discharge plasma, comprising:
    a discharge tube which has an opening portion confronting the surface of said sample, said opening portion being formed into the shape of a fan;
    means to generate a microwave discharge plasma in said discharge tube; and
    means for moving said sample along a circular path whose center coincides with the pivot of said fan, wherein said discharge tube is gradually tapered from a portion having a circular sectional shape towards said fan-shaped opening portion.

* * * * *